United States Patent

Cha et al.

Patent Number: 5,617,354
Date of Patent: Apr. 1, 1997

[54] SENSING CIRCUIT TO ENHANCE SENSING MARGIN

[75] Inventors: Byoung K. Cha; Chang W. Ha, both of Kyungki-Do, Rep. of Korea

[73] Assignee: Hyundai Electronics Industries Co., Ltd., Kyungki-Do, Rep. of Korea

[21] Appl. No.: 576,563

[22] Filed: Dec. 21, 1995

[30] Foreign Application Priority Data

Dec. 29, 1994 [KR] Rep. of Korea .................. 94-38577

[51] Int. Cl.$^6$ ................................................ G11C 7/00
[52] U.S. Cl. ........................... 365/185.21; 365/185.22; 365/189.11
[58] Field of Search ................... 365/185.21, 185.22, 365/185.29, 189.11

[56] References Cited

U.S. PATENT DOCUMENTS 5,056,063  10/1991  Santin et al. .................. 365/185.21
5,388,078  2/1995   Arakawa ....................... 365/185.21
5,396,467  3/1995   Liu et al. ..................... 365/185.21

FOREIGN PATENT DOCUMENTS 62-222498  9/1987  Japan.

Primary Examiner—Son T. Dinh
Attorney, Agent, or Firm—Fish & Richardson P.C.

[57] ABSTRACT

The present invention discloses a circuit for both detecting and confirming the memory cell which can verify the state of program and erasure on the memory cell when it performs a programming and an erasure onto or out of the memory cell after a normal read-out operation.

5 Claims, 1 Drawing Sheet

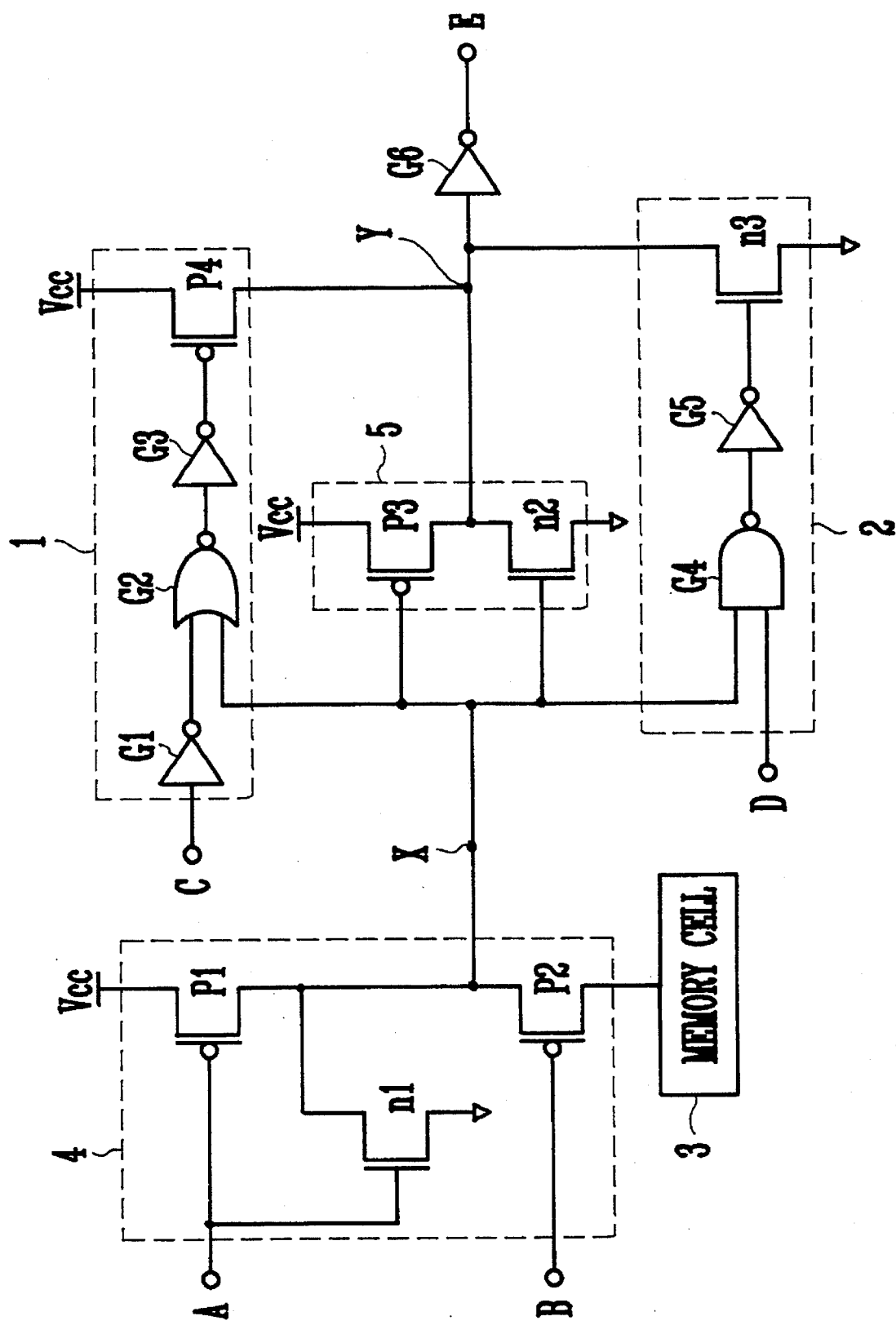

SENSING CIRCUIT TO ENHANCE SENSING MARGIN

FIELD OF THE INVENTION

The present invention relates to a sensing circuit to enhance sensing margin, and more particularly to a sensing circuit to enhance sensing margin, which can define the state of memory cells during programing and erasure operation.

BACKGROUND THE INVENTION

In general, the detection circuit for use in the memory cell can be used in all the memory devices such as flash EEPROM, EEPROM and EPROM etc. Such detection circuits have a drawback which has to control the threshold voltage of the memory cell to be higher or lower than the threshold voltage in a normal read-out operation, in case they perform a programming or an erasure while they perform a read-out operation having a threshold voltage in a normal read-out operation on the memory cell, and also they lack in reliability because they require an additional identification circuit that distinguishes the state of the memory cell.

SUMMARY OF THE INVENTION

Accordingly, the purpose of the present invention is to provide a sensing circuit to enhance sensing margin, which executes a read-out operation with a normal read-out threshold voltage but, when writing or erasing a program into or from the memory cell, it executes the operation with a different voltage corresponding to it and can verify the state of program or erasure by controlling the functions of detection and verification more flexible.

To accomplish the above purpose, a sensing circuit to enhance sensing margin according to the present invention, comprises:

a memory cell; a memory cell enable circuit for supplying an operation voltage for the memory cell based on first and second enable signals; a detection circuit for detecting a threshold voltage of the memory cell during a normal read-out operation; a first verification circuit for pulling up the output from the detection circuit based on the threshold voltage of the memory cell and the first control signal; and a second verification circuit for pulling down the output from the detection circuit based on the threshold voltage of the memory cell and the second control signal.

BRIEF DESCRIPTION OF THE DRAWINGS

For fuller understanding of the nature and objects of the invention, reference should be had to the following detailed description taken in conjunction with the accompanying drawings in which:

The accompanying drawing illustrates a sensing circuit to enhance sensing margin according to the present invention.

Similar reference characters refer to similar parts through the several views of the drawings.

DESCRIPTION OF THE INVENTION

Below, the present invention will be described in detail by reference to the accompanying drawing.

The accompanying drawing is a sensing circuit to enhance sensing margin in accordance with the present invention. The first and second enable signals A and B are maintained at a logical "LOW" state during a normal read-out operation on the memory cell. Therefore, the NMOS transistor n1 of a memory cell enable circuit 4 is turned off and the PMOS transistors P1 and P2 of the memory cell enable circuit 4 are turned on. Also, when the first control signal C is maintained at a logical "LOW" state, the output of an inverter gate G3 becomes a "HIGH" state because the output of an inverter G1 in the first verification circuit 1 becomes a "HIGH" state and the output of the NOR gate G2 becomes a "LOW" state. Therefore, the PMOS transistor P4 is maintained at a turn-off state. If the second control signal D is maintained at a logical "LOW" state, the output of the NAND gate G4 in the second verification circuit 2 becomes a "HIGH" state and the output of an inverter G5 becomes a "LOW" state. Therefore, the NMOS transistor n3 is maintained at a turn-off state. Accordingly the threshold voltage $V_T$ of a memory cell 3 is detected by the PMOS transistor P3 and the NMOS transistor n2 in a detection circuit 5. That is, in case that the data is stored in the memory cell 3, the NMOS transistor n2 is turned on while the PMOS transistor P3 in the detection circuit 5 is turned off because the node x becomes a "HIGH" state. Therefore, the node y becomes a "LOW" state and so the output E of an inverter G6 becomes a "HIGH" state.

After performing such read-out operation, in case of confirming the state of program in the memory cell 3, if the first and second enable signals A and B are maintained at a "LOW" state, the NMOS transistor n1 in the memory cell enable circuit 4 is turned off and the PMOS transistors P1 and P2 are turned on. If the second control signal D is maintained at a logical "LOW" state, the output of the inverter G5 in the second verification circuit 2 becomes a "LOW" state. Then, if the first control signal C is transferred from a logical "LOW" state to a logical "HIGH" state and the memory cell 3 is normally programmed, the output E as in the case of the read-out operation becomes a "HIGH" state because the voltage level in the node x is a "HIGH" state. However, if the memory cell 3 is not normally programmed, the PMOS transistors P3 and P4 are turned on and so the voltage level in the node y becomes a "HIGH" state because the voltage level in the node x becomes a "LOW" state. That is, the output E becomes a "LOW" state. The PMOS transistor P4 is used to pull up the node y.

Even when confirming the erasure state on the memory cell 3, after the read-out operation, the PMOS transistors P1 and P2 are turned on while the NMOS transistors n1 in the memory cell enable circuit 4 is turned off because the first and second enable signals A and B are maintained at a logical "LOW" state. If the first control signal C is maintained at a logical "LOW" state, the output of the inverter G3 in the first verification circuit 1 to which the first control gate C is input is maintained at a logical "HIGH" state regardless of the signal in the node x and accordingly the PMOS transistor P4 is maintained at a turn-off state. Then, if the second control signal D is transferred from a logical "LOW" state to a logical "HIGH" state and the memory cell 3 is normally erased, the output of the inverter G5 in the second identification circuit to which the second control signal D is input becomes a "LOW" state and so the NMOS transistor n3 is turned off. Therefore, the NMOS transistor n2 is turned off while the PMOS transistor P3 is turned on. As the voltage level in the node y becomes a "HIGH" state, the output E becomes a "LOW" state. However, in case the memory cell 3 is not normally erased, the NMOS transistors n2 and n3 are turned on because the voltage level in the node x becomes a "HIGH" state and so the voltage level in the node y becomes a "LOW" state. That is, the output E becomes a "HIGH" state. The NMOS transistor n1 is used to pull down said node y. The NMOS transistor n1 is used to make the voltage level in the node x a zero (0) at the beginning of the operation.

As described above, the present invention has an excellent effect which can increase the reliability of a flash memory device which can identify exactly the state of program and erasure in the memory cell, but after performing a read-out operation with a normal read-out threshold voltage, when writing or erasing a program into or from the memory cell, it can perform the operation with a different voltage corresponding to it by controlling the functions of detection and verification more flexible.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

We claim:

1. A sensing circuit to enhance sensing margin comprising:
   a memory cell;
   a memory cell enable circuit for supplying an operation voltage for said memory cell based on first and second enable signals;
   a detection circuit for detecting a threshold voltage of said memory cell during a normal read-out operation;
   a first verification circuit for pulling up the output from said detection circuit based on the threshold voltage of said memory cell and a first control signal; and
   a second verification circuit for pulling down the output from said detection circuit based on the threshold voltage of said memory cell and a second control signal.

2. The sensing circuit of claim 1, wherein said memory cell enable circuit comprises a first PMOS transistor connected serially between a $V_{CC}$ terminal and said memory cell through a first the node, said first PMOS transistor being the input to each of the first and second enable signals, and a first NMOS transistor connected between the first node and the ground, said NMOS transistor being the input to the first enable signal.

3. The sensing circuit of claim 2, wherein said detection circuit comprises a second PMOS transistor and a second NMOS transistor both connected serially between a $V_{CC}$ terminal and the ground through a second node, said second PMOS transistor and said second NMOS transistor being operated based on the voltage level in the first node.

4. The sensing circuit of claim 1, wherein said first verification circuit comprises a first inverter being the input to the first control signal, a NOR gate being the inputs to each of the output signal from said first inverter and the voltage level in a first node, a second inverter being the input to the output signal from said NOR gate, and a PMOS transistor connected between a $V_{CC}$ terminal and a second node and being the input to the output signal from said second inverter.

5. The sensing circuit of claim 1, wherein said second verification circuit comprises a NAND gate being the input to the second control signal and the voltage level in a first node, a inverter being the input to the output signal from said NAND gate, and a NMOS transistor connected between a second node and the ground and being the input to the output signal from said inverter.

* * * * *